USO10115821B2

(12) United States Patent
Ponoth et al.

(10) Patent No.: US 10,115,821 B2
(45) Date of Patent: Oct. 30, 2018

(54) FDSOI LDMOS SEMICONDUCTOR DEVICE

(71) Applicant: Avago Technologies General IP (Singapore) Pte. Ltd., Singapore (SG)

(72) Inventors: Shom Ponoth, Irvine, CA (US); Akira Ito, Irvine, CA (US); Qing Liu, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/383,592

(22) Filed: Dec. 19, 2016

(65) Prior Publication Data
US 2018/0122942 A1  May 3, 2018

Related U.S. Application Data

(60) Provisional application No. 62/414,298, filed on Oct. 28, 2016.

(51) Int. Cl.
| H01L 27/12 | (2006.01) |
| H01L 29/78 | (2006.01) |
| H01L 29/08 | (2006.01) |
| H01L 29/10 | (2006.01) |
| H01L 29/06 | (2006.01) |

(52) U.S. Cl.
CPC ...... H01L 29/7835 (2013.01); H01L 29/0649 (2013.01); H01L 29/0847 (2013.01); H01L 29/1033 (2013.01); H01L 29/1095 (2013.01)

(58) Field of Classification Search
USPC ......................................... 257/348
See application file for complete search history.

(56) References Cited

U.S. PATENT DOCUMENTS 9,048,132 B2 *  6/2015  Ko ............... H01L 29/66659
2017/0338343 A1 * 11/2017  Baudot .......... H01L 21/823814

* cited by examiner

Primary Examiner — Timor Karimy
(74) Attorney, Agent, or Firm — Sterne, Kessler, Goldstein & Fox P.L.L.C.

(57) ABSTRACT

Semiconductor devices are provided that use both silicon on insulator region and bulk region of a fully depleted silicon on insulator (FDSOI) device. For example, a semiconductor device includes a drain region that is disposed above a first type well and a first drain extension region that is disposed above the first type well and laterally spaced apart from the drain region. The semiconductor device further includes a second drain extension region that is disposed above the first type well and is laterally spaced apart from the drain region and the first drain extension region. The semiconductor device further includes a source region disposed above a second type well and laterally spaced apart from the second drain extension.

20 Claims, 3 Drawing Sheets

FDSOI LDMOS SEMICONDUCTOR DEVICE

CROSS REFERENCE TO RELATED APPLICATIONS

The present application claims the benefit of U.S. Provisional Patent Application No. 62/414,298, filed on Oct. 28, 2016, which is hereby incorporated by reference in its entirety.

BACKGROUND

Field

Embodiments of the present disclosure relate generally to the physical structure of a metal oxide semiconductor (MOS), including implementing a laterally diffused metal oxide semiconductor (LDMOS) on a fully depleted silicon on insulator (FDSOI) semiconductor device.

Background

Advances in semiconductor technologies have resulted in dramatically increased circuit packing densities and higher speeds of operation. In order to achieve such increased densities, a wide variety of evolutionary changes have taken place with respect to semiconductor processing techniques and semiconductor device structures.

As technologies evolve to produce smaller and denser circuits, the evolution has also engendered challenges. As an example, as semiconductor devices are made to be smaller and denser, their applicability to high voltage applications have presented a challenge with respect to the breakdown voltages of the semiconductor device. As an example, an FDSOI device formed on 28 nm nodes can offer higher performance, lower power, and low drain-to-drain voltage (Vdd) as compared to a 28 nm bulk semiconductor device. However, current FDSOI devices do not include high voltage devices such for power amplifier applications and power management due an inadequate breakdown voltage in devices made with smaller process technologies. As the operating voltages applied to the transistors increase, the transistors can eventually breakdown causing an uncontrollable increase in current that ultimately can damage the device. Examples of the detrimental effects of the breakdown may include punch-through, avalanche breakdown, and gate oxide breakdown.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art(s) to make and use the disclosure.

Figure 1A:
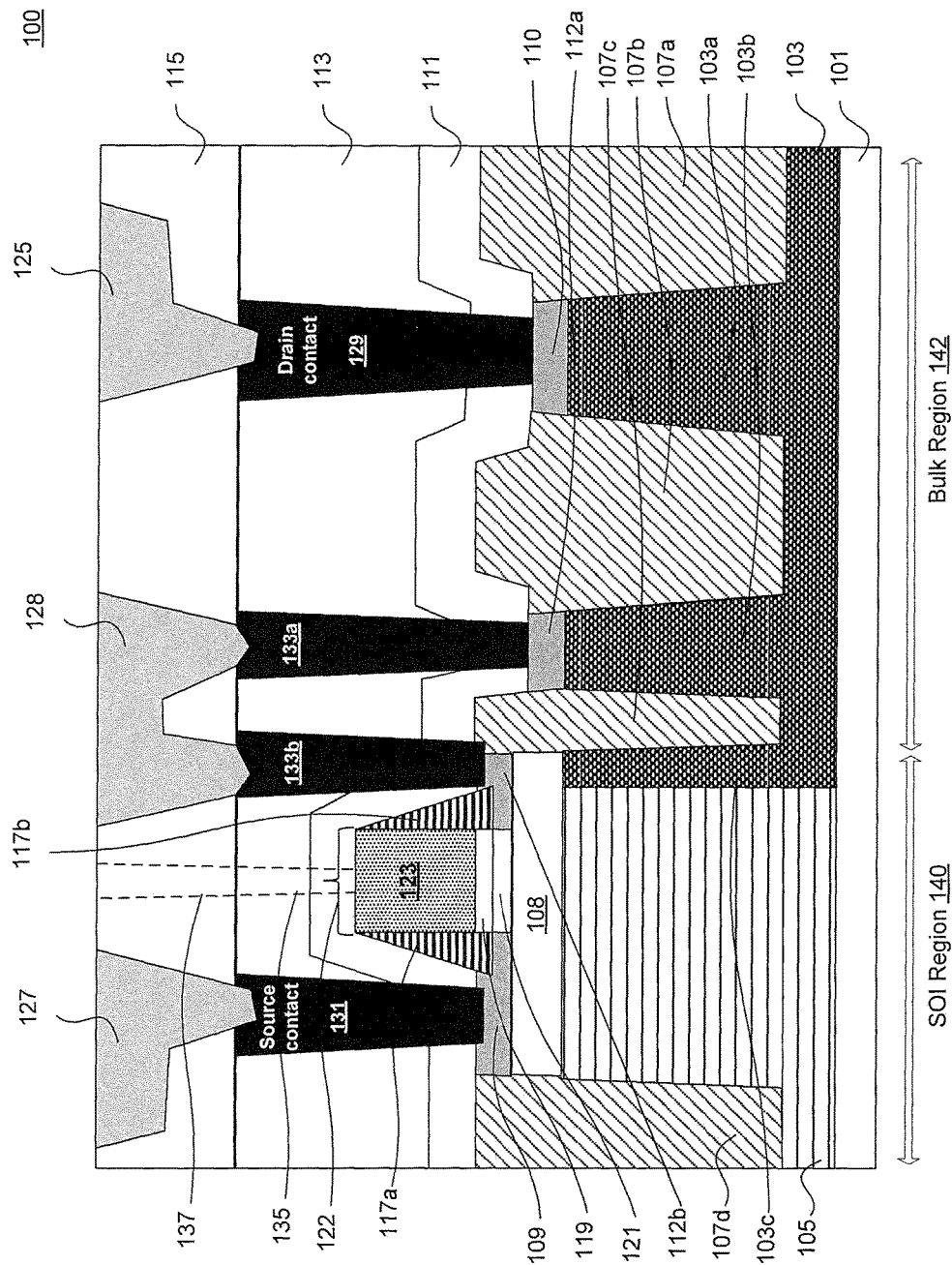
FIG. 1A shows an example of a laterally diffused metal oxide semiconductor (LDMOS) on a fully depleted silicon on insulator (FDSOI) device, according to some embodiments of the disclosure.

The present disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Overview

Semiconductor devices are provided that use both the silicon on insulator region and the bulk region of a fully depleted silicon on insulator (FDSOI) device, which enables better electrostatic performance, area efficiency, threshold voltage tunability, lower leakage current, and higher drive current.

According to one embodiment of the disclosure, a semiconductor device includes a drain region that is disposed above a first type well and a first drain extension region that is disposed above the first type well and laterally spaced apart from the drain region. The semiconductor device further includes a second drain extension region that is disposed above the first type well and is laterally spaced apart from the drain region and the first drain extension region. The semiconductor device further includes a source region disposed above a second type well and laterally spaced apart from the second drain extension.

According to another embodiment of the disclosure, a semiconductor device is provided that includes an extended drain region. The extended drain region includes a drain region disposed above a first type well, a first drain extension region disposed above the first type well, and a second drain extension region disposed above the first type well. The drain region, the first drain extension region, and the second drain extension region are laterally spaced apart from each other. Also, the first drain extension region is electrically coupled with the second drain extension region. The semiconductor device further includes a source region that is disposed above a second type well and is laterally spaced apart from the extended drain extension. The semiconductor device further includes a channel layer that is disposed above the second type well and is disposed laterally between the source region and the extended drain region.

According to another embodiment of the disclosure, a semiconductor device is provided that includes a base silicon layer and a bulk region formed on the base silicon layer. The bulk region includes a first type well divided by a shallow trench isolation (STI) layer into a first portion, a second portion, and a third portion. The bulk region further includes a drain region disposed above the first portion of the first type well. The bulk region further includes a first drain extension region disposed above the second portion of the first type well and a second drain extension region disposed above the third portion of the first type well. The drain region, the first drain extension region, and the second drain extension region are laterally spaced apart from each other. The first drain extension region is electrically coupled with the second drain extension region using a metal contact. The semiconductor device further includes a silicon-on-insulator (SOI) region formed on the base silicon layer and adjacent to the bulk region. The SOI region includes a source region disposed above a second type well and laterally spaced apart from the second drain extension region. The SOI region further includes a buried oxide (BOX) layer disposed above and in contact with the first type well and the second type well, and laterally spaced apart from the drain region and the first drain extension region. The second drain extension region and the source region are disposed above and in contact with the BOX layer. The SOI region further includes a channel layer disposed above the BOX layer and laterally disposed in between the source region and the second drain extension region. The SOI region further includes a gate structure disposed above and in contact with the channel layer.

Detailed Discussion

The following Detailed Description refers to accompanying drawings to illustrate exemplary embodiments consistent with the disclosure. In the following description, numerous specific details are set forth in order to provide a thorough understanding. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure. The exemplary embodiments described herein are provided for illustrative purposes, and are not limiting. Other exemplary embodiments are possible, and modifications can be made to the exemplary embodiments within the spirit and scope of the disclosure.

FIG. 1A shows an example of a laterally diffused metal oxide semiconductor (LDMOS) on a fully depleted silicon on insulator (FDSOI) device, according to some embodiments of the disclosure. As illustrated in FIG. 1A, FDSOI LDMOS device 100 can include a base silicon layer 101. A N-well/P-well 103 (herein N/P well 103 for brevity) can be disposed above the base silicon layer 101. A N-well/P-well 105 (herein N/P well 105 for brevity) can also be disposed above base silicon layer 101 and is disposed adjacent to N/P well 103 as illustrated in FIG. 1A. The N/P well 105 is implemented as a P-well when paired with an N/P well 103 that is implemented as an N-well, as shown. Alternatively, the N/P well 105 can be implemented as an N-well when paired with an N/P well 103 that is implemented as a P-well. Stated differently, the doping type of N/P well 103 is opposite of the doping type of N/P well 105. In one example, silicon can be doped with phosphorus to create an N-well, or can be doped with boron to create a P-well. Accordingly, the designation of "n" and a "p" refers to n-type and p-type semiconductor material, as will be understood by those skilled in the arts.

The N/P well 105 can be biased (i.e., have a voltage applied to it) during operation of the semiconductor device 100. By biasing the N/P well 105, the behavior of the transistor can be controlled not only through the gate but also through the N/P well in a similar manner to the body biasing available in bulk semiconductor technologies. By body biasing the device, the threshold voltage (i.e., the turn-on voltage) of the device can be manipulated. In one example, if the N/P well 105 is implemented as an N-well, then by applying a voltage to the N-well 105, the threshold voltage of the device can be lowered. In another example, if the N/P well 105 is implemented as a P-well, then by applying a voltage to the P-well 105, the threshold voltage of the device can be raised.

A buried oxide (BOX) layer 108 can be disposed above part of N/P well 105 and part of N/P well 103. The BOX layer 108 can be an ultra-thin layer of insulator. BOX layer 108 can have a thickness of approximately 20 nm and acts to reduce parasitic capacitance between source 109 and drain extension 112b. Also, the BOX layer 108 allows for the efficient confinement of the electrons that flow from source 109 to drain 110 via channel layer 121, contacts 133a and 133b, metal 128, N/P well 103, thus reducing performance-degrading leakage currents. BOX layer 108 can be implemented using silicon oxide ($SiO_2$) or other like insulator, or oxide materials.

Layer 107 (denoted as 107a, 107b, 107c, and 107d in FIG. 1A) can include a shallow trench isolation (STI) layer, which can reduce electric current leakage between adjacent components. The STI layer 107 can be deposited using a process that involves etching a pattern of trenches in the silicon, depositing one or more dielectric materials (such as silicon dioxide) to fill the trenches, and removing the excess dielectric using a technique such as chemical-mechanical planarization. STI layer 107 can be deposited adjacent to N/P well 105, box layer 108, source 109, N/P well 103, drain 110, and drain extensions 112 (denoted as 112a and 112b in FIG. 1A.)

A channel layer 121 can be disposed above and can be in contact with BOX layer 108. Channel layer 121 can be disposed adjacent to source 109 and drain extension 112b. Channel layer 121 can be implemented using a very thin (approximately 4 nm-10 nm, such as 6 nm in one example) silicon film. Due to its thinness, channel layer 121 can be undoped, which makes channel layer 121 fully depleted (i.e. substantially devoid of either electron or hole carriers) when unbiased. More specifically, the thinness of channel layer 121 can allow for more stable control of electron flow within the layer (i.e., reduced leakage currents) thus allowing for channel layer 121 to be undoped. In some examples, channel layer 121 can be doped, but relatively undoped with respect to N/P well 105 and N/P well 103. In one example, the doping of N/P well 105 can be around $10^{18}$ to $10^{19}$ atoms/$cm^3$. However, it is noted that other doping values can also be used.

A source region 109 and a drain extension region 112b are disposed adjacent to channel layer 121 in a silicon on insulator (SOI) region 140. Source 109 and drain extension 112b are disposed above BOX layer 108. A drain region 110 and a drain extension region 112a are disposed above N/P well 103 and adjacent to portions of STI layer 107 in the bulk region 142, as illustrated in FIG. 1A. In one example, SOI region 140 is part of device 100 that includes BOX 108. Therefore, in this example, SOI region 140 stops where BOX layer 108 stops next to STI 107c. In other words, the boundary of the SOI region 140 is aligned with the boundary of BOX layer 108. In this example, bulk region 142 is part of device 100 that does not include BOX 108, shown in FIG. 1A.

N/P well 103 can include three portions 103a-c. Drain 110 can be disposed above and can be in contact with the first portion 103a of N/P well 103. Drain extension 112a can be disposed above and can be in contact with the second portion 103b of N/P well 103. Drain extension 112a is laterally spaced apart from drain 110. Drain extension 112b can be disposed above and can be in contact with the third portion 103c of N/P well 103. Drain extension 112b is laterally spaced apart from drain extension 112a and drain 110, so that drain extension 112b is adjacent to, and in contact with channel layer 121.

Source 109, drain 110, and drain extensions 112 can be implemented in a raised source/drain (RSD) architecture meaning that they are formed above the channel in whole, or in part. Source 109, drain 110, and drain extensions 112 can either be p or n doped depending on the type of semiconductor device. In the case of the pnp device, source 109, drain 110, and drain extensions 112 can be p+ doped and in the case of an npn device source 109, drain 110, and drain extensions 112 can be n+ doped. For example, when N/P well 105 is implemented as a P-well when paired with the N/P well 103 implemented as an N-well as shown, then source 109, drain 110, and drain extensions 112 can be n-doped (using, for example, Phosphorus doped silicon epitaxy or Phosphorus doped Silicon Carbide (SiC) epitaxy). Stated differently, N/P well 103 has the same doping type as source 109, drain 110, and drain extensions 112. Accordingly, when the N/P well 105 is implemented as an N-well with the N/P well 103 implemented as a P-well, then source 109, drain 110, and drain extensions 112 can be p+ doped (using, for example, Boron doped Silicon-Germanium (SiGe) epitaxy). The source, drain, and drain extension regions can be formed using epitaxy. In some embodiments of the disclosure, the epitaxy used to grow the source, drain, and drain extension regions is a "selective" epitaxy that only grows on silicon based regions of the device that the epitaxial film is exposed to.

Source 109, drain 110, and drain extensions 112 can be doped using standard doping techniques. In the instance of FDSOI type devices, the doping source 109, drain 110, and drain extensions 112 can be achieved by implant doping or alternatively by using in-situ doping. In implant doping, the dopants are introduced to source 109, drain 110, and drain extensions 112 after the epitaxial film is used to create the raised source/drain regions has been grown. In in-situ doping, the dopants are introduces during the process of growing the epitaxial film on the raised source/drain regions.

In on example, source 109 and drain extension 112b can be doped using in-situ epitaxy drive-in process. In this example, first source 109 and drain extension 112b are grown adjacent to spacers 117 using in-situ epitaxy. Then a drive-in process is performed to grow source 109 and drain extension 112b toward gate structure 122 so that there is an overlap region such that gate 122 can control characteristic of device 100. In one example, source 109, drain 110, and drain extensions 112 can have a thickness of approximately 15 nm-30 nm.

A gate structure 122 can be disposed above channel layer 121 and in between source 109 and drain extension 112b as illustrated in FIG. 1A. Gate structure 122 can include a gate dielectric (not shown in FIG. 1A but layer 153 in FIG. 1B) and a gate metal 123 in an exemplary embodiment. Gate structure 122 can be approximately equidistant between source 109 and drain extension 112b in an embodiment. However in other embodiments, gate structure 122 can be spaced so as to be disposed closer to either source 109 and drain extension 112b. Gate structure 122 can include a work function metal 119 disposed over channel layer 121 and between channel layer 121 and gate metal 123.

Spacers 117 (denoted as 117a and 117b in FIG. 1A) are disposed adjacent to gate structure 122 as illustrated in FIG. 1A and act to provide the required spacing between source 109, drain extension 112b, and gate structure 122. A first portion 117a of spacer 117 can be disposed above source region 109. A second portion 117b of spacer 117 can be disposed above drain extension 112b.

A liner layer 111 can be deposited over N/P well 103, gate 122, spacers 117, source 109, drain extensions 112, and drain 110. In some embodiments, liner layer 111 can include a Nitride liner that can provide various benefits such as stress protection.

An insulator layer 113 can be deposited over liner layer 111. In one example, insulator layer 113 can include a middle-end of line (MEOL) oxide. In some embodiments, insulator layer 113 can be silicon oxide. Additionally or alternatively, insulator layer 113 can be similar to STI layer 107. Alternatively, insulator layer 113 can be a lower quality insulator than STI layer 107. Device 100 can also include another insulator layer 115 as a backend layer. Insulator layer 115 can be made of a low-K dielectric material. Additionally or alternatively, insulator layer 115 can be a carbon doped oxide dielectric comprised of Si, C, O, and H (SiCOH). In one example, layer 115 can seal the device from the environment to avoid damage.

Device 100 also includes contacts 129, 131, and 133 (denoted as contacts 133a and 133b in FIG. 1A). Drain contact 129 is disposed above and is in contact with drain 110 and is configured to connect drain 110 to outside through metal 125. Source contact 131 is disposed above and is in contact with source 109 and is configured to connect source 109 to outside through metal 127. In one example, contacts 129, 131, and 133 can be made of Tungsten and metals 125, 127, and 128 can be made of copper. In this example, Tungsten has better filling properties and lower diffusibility that is more appropriate to be used for contacts. In other words, Tungsten can be easier for fabrication of contacts compared to copper. However, these are exemplary materials and other materials can be used to make contacts 129, 131, and 133 and metals 125, 127, and 128.

A contact 135 and a metal 137 are also disposed above gate structure 122 and connect to gate structure 122 such that gate structure 122 can be connected to outside. Contact 135 and metal 137 are shown in dashed line because their location can be different from the location of contacts 129, 131, 133 and metals 125, 127, 128. For example, from a top view, contact 135 and metal 137 can be located behind contacts 129, 131, 133 and metals 125, 127, 128, and therefore not visible in this cross-section view. Accordingly, contact 135 and metal 137 are shown in dashed line in the cross-section view of FIG. 1A (and also FIGS. 1B and 2.)

Contacts 133a and 133b are disposed above and are in contact with drain extensions 112a and 112b, respectively. Metal 128 connects contact 133a to 133b, such that drain extensions 112a and 112b are electrically coupled to each other. Therefore, device 100 has an extended drain that includes drain 110 and drain extensions 112a and 112b. All or most of the extended drain of device 100 is included in the bulk region 142 of FDSOI LDMOS device 100. The majority of the voltage drop of the LDMOS occurs over this extend drain. Whereas, source 109 and gate 122 are located in the SOI region 140 of FDSOI LDMOS device 100. In one example, when current flows from drain 110 to source 109, the current flows from drain 110 through N-well 103, drain extension 112a, contact 133a, metal 128, contact 133b, drain extension 112b, channel layer 121, to reach source 109. More specifically, the STI layer portions (107a-107c) separate the N-well 103 into the identified N-well portions 103a-c causing the current to flow around the respective the STI layer portions, given their dielectric properties. For example, the current from drain 110 must flow around STI layer portion 107b to reach drain extension 112a, which creates a longer and more resistive path, than would occur if STI layer portion 107b was not present. This, in-turn can improve voltage breakdown characteristics.

In conventional devices, the bulk region is used for fabricating conventional bulk silicon devices. In these conventional devices, typically the SOI and bulk devices are isolated and are independent devices. When an LDMOS device is fabricated in the bulk region only, then the LDMOS device does not use the thin SOI channel that provides better electrostatics, and also forgoes the ability to effectively tune the threshold voltage Vt of the device. Whereas, if the LDMOS device is built only in the SOI region, then due to the SOI relative thinness, the lightly doped drain (LDD) region will have large on-resistance and lower linear current, which can be detrimental in analog applications. In contrast, the embodiments of this disclosure include devices that are fabricated using both the SOI region and the bulk region, to utilize the advantages of each region.

According to one example, the voltage at the junction between drain extension 112b and channel layer 109 should be approximately, or less than, 1.8 volts. If the voltage at that junction is more than 1.8 volts, it could result in breakdown of gate dielectric. The LDMOS FDSOI devices of the embodiments of this disclosure increase the resistance between the source 109 and drain 110 by using bulk region 142 as discussed above in regards to current flow through N-well 103. The increased resistance provides the device 100 with a higher voltage at the drain 110 thus making it suitable for higher voltage applications. LDMOS FDSOI devices of the embodiments of this disclosure take advantage of the fully depleted channel for better electrostatics and lower leakage current, in addition to having a higher voltage at drain 110 by using the bulk region. More specifically, the SOI region 140 enables a low gate-to-source turn-on voltage given the thin channel layer 121 and the back bias capabilities of N/P well 105. Whereas, the bulk region 142 enables a high drain-to-gate breakdown voltage via the extended current path caused by the STI layer 107 and the extended drain regions 112 described above.

In other words, compared to conventional devices built only on bulk region, LDMOS FDSOI devices of the embodiments of this disclosure can maintain similar voltage at its drain but having a smaller area footprint. For example, a conventional device built only on bulk region would have a gate with a width of 300 nm. LDMOS FDSOI devices of the embodiments of this disclosure can maintain similar drain voltage with a gate with width of 150 nm-200 nm.

Figure 1B:
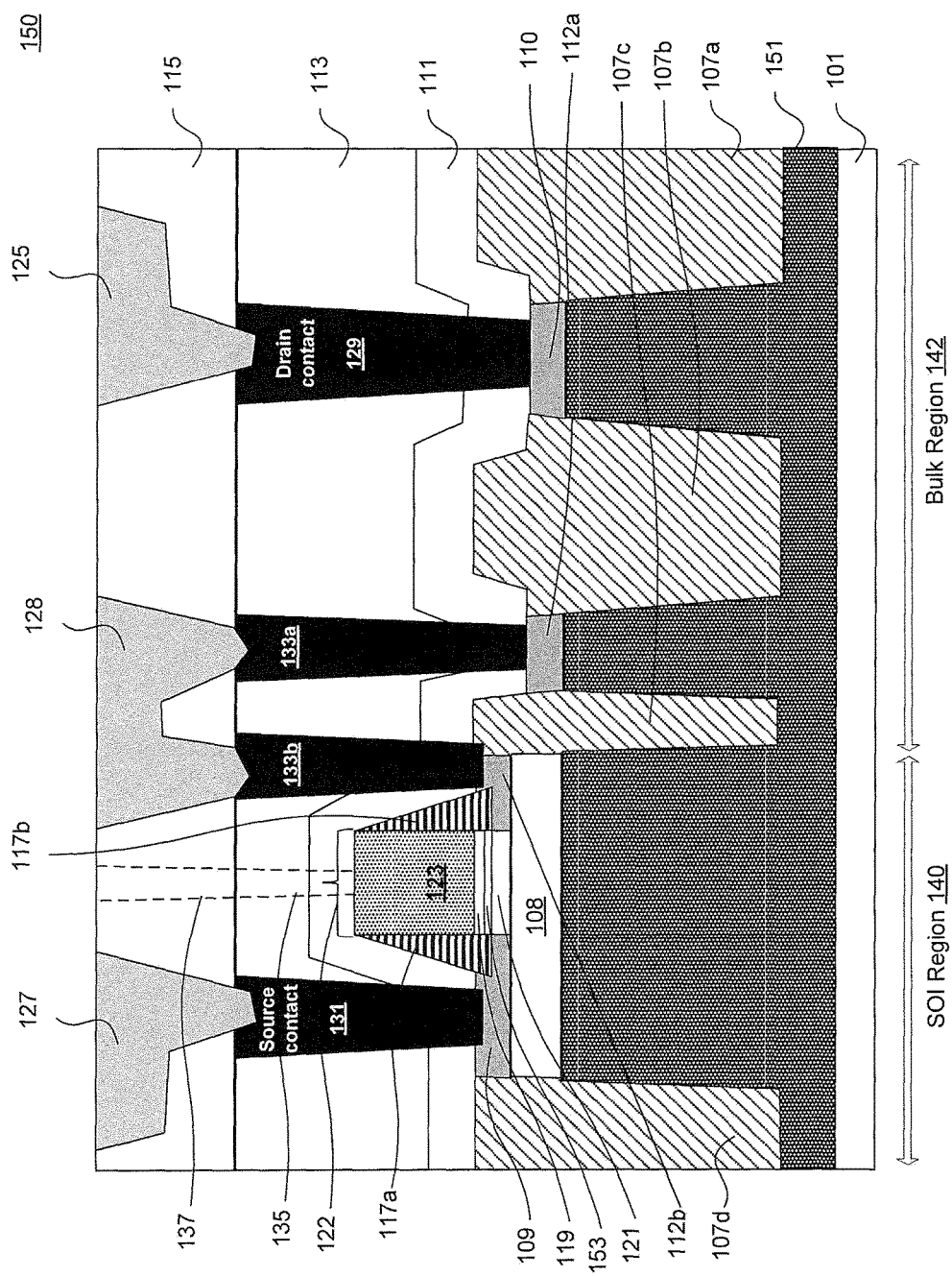
FIG. 1B shows another example of an LDMOS on a FDSOI device, according to some embodiments of the disclosure.

FIG. 1B shows an example of an LDMOS FDSOI device according another embodiment of the disclosure. The device illustrated in FIG. 1B is similar to the device of FIG. 1A and thus the description regarding most of its layers is similar to that discussed above with respect to the discussion of their counterparts in FIG. 1A.

One exemplary difference between device 150 of FIG. 1B and device 100 of FIG. 1A is that device 150 of FIG. 1B does not include the N/P well 105 of FIG. 1A. Instead device 150 includes a N-well 151 as shown disposed above base silicon layer 101 that extends in place of N/P well 105 of FIG. 1A. Alternatively, layer 151 can be a P-well. In the example device 200, the threshold voltage Vt would be lower with respect to the example device 100 of FIG. 1A by using the N-well 151.

Also, illustrated in FIG. 1B is a gate dielectric 153 of gate structure 122. Gate structure 122 can include gate dielectric 153 disposed above channel 108, a work function metal 119 disposed above gate dielectric 153, and gate metal 123 disposed above work function metal 119. As discussed above with respect to FIG. 1A, gate structure 122 of device 100 can also include the gate dielectric (although not shown in FIG. 1A.)

Figure 2:
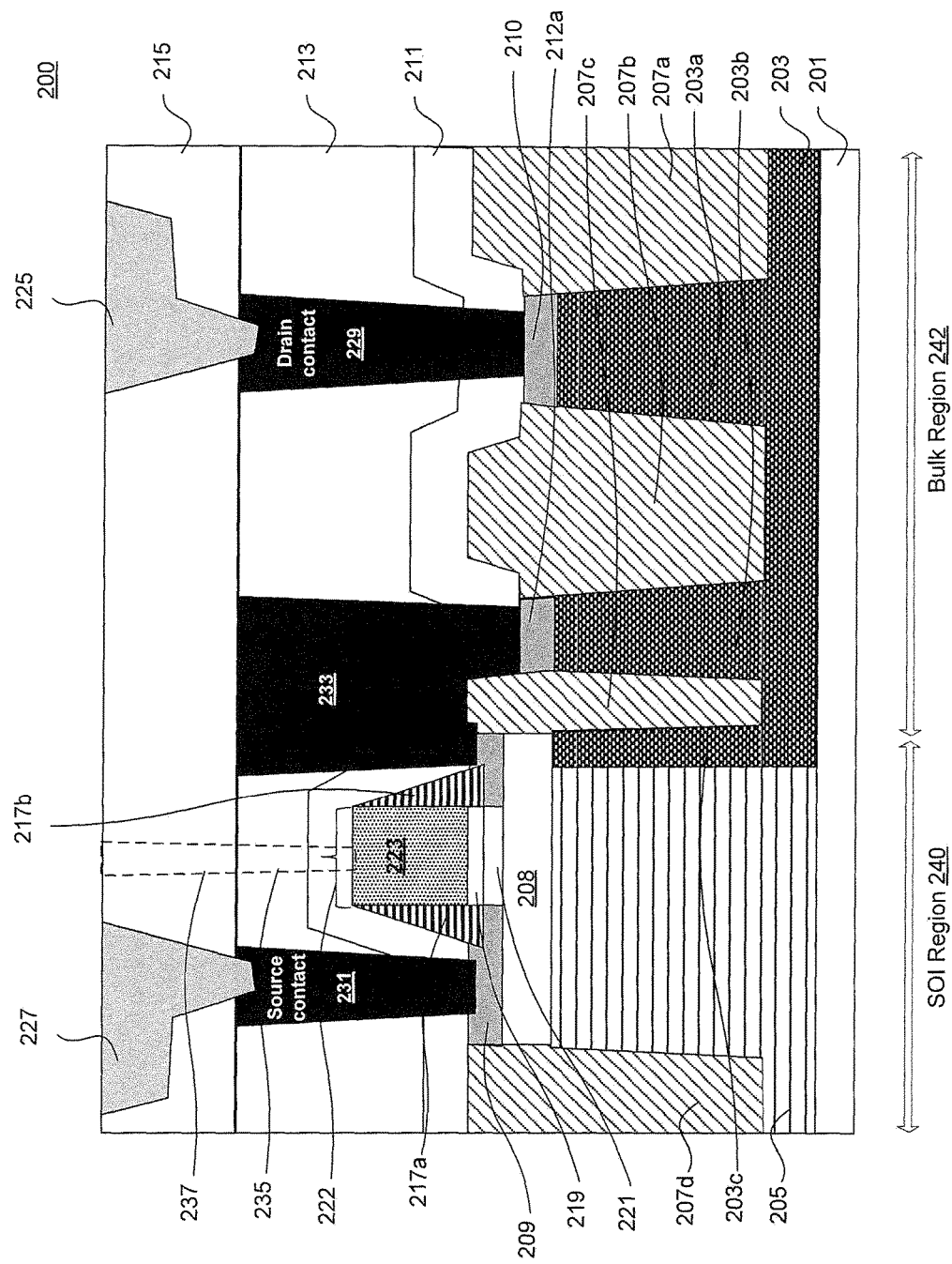
FIG. 2 shows another example of an LDMOS on a FDSOI device, according to some embodiments of the disclosure.

FIG. 2 shows an example of an LDMOS FDSOI device according another embodiment. The device illustrated in FIG. 2 is similar to the device of FIG. 1A and thus the description regarding most of its layers is similar to that discussed above with respect to the discussion of their counterparts in FIG. 1A.

In contrast to the exemplary embodiments of FIGS. 1A and 1B that include two contacts 133a and 133b that are disposed above drain extensions 112 and are connected to each other through metal 128, LDMOS FDSOI device 200 of FIG. 2 includes one contact 233. In this example, contact 233 is disposed above and is in contact with drain extension 212a and drain extension 212b and connects the drain extensions 212 together to form, along with drain 210, the extended drain of the LDMOS FDSOI device. In these embodiments, device 200 has an extended drain that includes drain 210 and drain extensions 212a and 212b. All or most of the extended drain of device 200 is included in the bulk region 242 of FDSOI LDMOS device 200. Whereas, source 209 and gate 222 are located in the SOI region 240 of FDSOI LDMOS device 200.

While examples of the disclosure above have been illustrated using FDSOI devices, the disclosure is not so limiting and could also apply to bulk devices that possess extended drain architectures similar to the examples discussed above.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance provided herein.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. In addition, the terminology used herein is for the purpose of describing particular embodiments only and is not intended to be limiting. For example, as used herein, the singular forms "a," "an" and "the" are intended to include the plural forms as well, unless the context clearly indicates otherwise. It will be further understood that the terms "comprises," "comprising," "includes" and "including," when used herein, specify the presence of stated features, integers, steps, operations, elements, and components, but do not preclude the presence or addition of one or more other features, integers, steps, operations, elements, components, or groups thereof.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It is to be appreciated that the Detailed Description section, and not the Abstract section, is intended to be used to interpret the following claims. The Abstract section may set forth one or more, but not all exemplary embodiments, of the disclosure, and thus, are not intended to limit the disclosure and the appended claims in any way.

It will be apparent to those skilled in the relevant art(s) that various changes in form and detail can be made therein without departing from the spirit and scope of the disclosure. Thus the disclosure should not be limited by any of the above-described exemplary embodiments. Further, the claims should be defined only in accordance with their recitations and their equivalents.

What is claimed is:

1. A fully depleted silicon-on-insulator (FDSOI) semiconductor device, comprising:
    a drain region disposed above a first type well;
    a first drain extension region disposed above the first type well and laterally spaced apart from the drain region;
    a second drain extension region disposed above the first type well and laterally spaced apart from the drain region and the first drain extension region; and
    a source region disposed above a second type well and laterally spaced apart from the second drain extension region,
    wherein the drain region and the first drain extension region are disposed above and in contact with a bulk region of the FDSOI semiconductor device, and
    wherein the source region and the second drain extension region are disposed above and in contact with a silicon-on-insulator (SOI) region of the FDSOI semiconductor device.

2. The FDSOI semiconductor device of claim 1, further comprising:
    a first contact disposed above and in contact with the first drain extension region; and
    a second contact disposed above and in contact with the second drain extension region.

3. The FDSOI semiconductor device of claim 2, further comprising:
    a metal disposed above and in contact with the first and second contacts.

4. The FDSOI semiconductor device of claim 1, further comprising:
    a single contact disposed above and in contact with both the first and second drain extension regions.

5. The FDSOI semiconductor device of claim 1, wherein the first and second type wells are same.

6. The FDSOI semiconductor device of claim 1, wherein:
    the first type well comprises a first portion, a second portion, and a third portion,
    the drain region is disposed above and in contact with the first portion of the first type well,
    the first drain extension region is disposed above and in contact with the second portion of the first type well, and
    the second drain extension region is disposed above the third portion of the first type well.

7. The FDSOI semiconductor device of claim 6, wherein the first portion, the second portion, and the third portion of the first type well are separated by corresponding shallow trench isolation (STI) regions.

8. The semiconductor device of claim 1, wherein the source region and the drain region are doped using in-situ doping techniques.

9. The FDSOI semiconductor device of claim 1, wherein the second drain extension region is disposed above both the first type well and the second type well.

10. A semiconductor device, comprising:
    a drain region disposed above a first type well;
    a first drain extension region disposed above the first type well and laterally spaced apart from the drain region;
    a second drain extension region disposed above the first type well and laterally spaced apart from the drain region and the first drain extension region;
    a source region disposed above a second type well and laterally spaced apart from the second drain extension; and
    a buried oxide (BOX) layer disposed above and in contact with the first type well and the second type well, and laterally spaced apart from the drain region and the first drain extension region,
    wherein the second drain extension region and the source region are disposed above and in contact with the BOX layer.

11. The semiconductor device of claim 10, further comprising:
    a channel layer disposed above the BOX layer and laterally disposed in between the source region and the second drain extension region.

12. The semiconductor device of claim 11, further comprising:
    a gate structure disposed above and in contact with the channel layer; and
    a spacer layer comprising a first portion disposed above the source region and a second portion disposed above the second drain extension region.

13. The semiconductor device of claim 12, wherein the gate structure comprises:
    a gate dielectric disposed above and in contact with the channel layer;
    a work function metal deposited over and in contact with the gate dielectric; and
    a gate metal disposed over and in contact with the work function metal.

14. A fully depleted silicon-on-insulator (FDSOI) semiconductor device, comprising:
    an extended drain region comprising:
        a drain region disposed above a first type well;
        a first drain extension region disposed above the first type well; and
        a second drain extension region disposed above the first type well,
        wherein the drain region, the first drain extension region, and the second drain extension region are laterally spaced apart from each other, and
        wherein the first drain extension region is electrically coupled with the second drain extension region;
    a source region disposed above a second type well and laterally spaced apart from the extended drain region; and
    a channel layer disposed above the second type well and disposed laterally between the source region and the extended drain region,
    wherein the drain region and the first drain extension region are disposed above and in contact with a bulk region of the FDSOI semiconductor device, and
    wherein the source region, the channel layer, and the second drain extension region are disposed above and in contact with a silicon-on-insulator (SOI) region of the FDSOI semiconductor device.

15. The FDSOI semiconductor device of claim 14, further comprising:
a first contact disposed above and in contact with the first drain extension region; and
a second contact disposed above and in contact with the second drain extension region.

16. The FDSOI semiconductor device of claim 15, further comprising:
a metal disposed above and in contact with the first and second contacts to electrically couple the first drain extension region to the second drain extension region.

17. The FDSOI semiconductor device of claim 14, further comprising;
a single contact disposed above and in contact with both the first and second drain extension regions to electrically couple the first drain extension region to the second drain extension region.

18. The FDSOI semiconductor device of claim 14, further comprising:
a buried oxide (BOX) layer disposed above and in contact with the first type well and the second type well, and laterally spaced apart from the drain region and the first drain extension region,
wherein the second drain extension region and the source region are disposed above and in contact with the BOX layer.

19. The FDSOI semiconductor device of claim 14, further comprising:
a gate structure disposed above and in contact with the channel layer; and
a spacer layer comprising a first portion disposed above the source region and a second portion disposed above the second drain extension region.

20. The FDSOI semiconductor device of claim 14, wherein the second drain extension region is disposed above both the first type well and the second type well.

* * * * *